United States Patent [19]

Swift et al.

[11] Patent Number: 4,728,904

[45] Date of Patent: Mar. 1, 1988

[54] EXTRA HIGH FREQUENCY (EHF) CIRCUIT MODULE

[75] Inventors: Gerald W. Swift, Rolling Hills Estates; Patrick J. O'Sullivan, Manhattan Beach, both of Calif.

[73] Assignee: TRW Inc., Redondo Beach, Calif.

[21] Appl. No.: 9,644

[22] Filed: Jan. 27, 1987

Related U.S. Application Data

[63] Continuation of Ser. No. 737,630, May 24, 1985, abandoned.

[51] Int. Cl.[4] .......... H03F 3/60

[52] U.S. Cl. .......... 330/286; 330/295; 333/26; 333/33; 333/254

[58] Field of Search .......... 333/26, 33, 238, 246, 333/247, 260; 330/286, 295

[56] References Cited

U.S. PATENT DOCUMENTS

| | | | |
|---|---|---|---|
| 3,577,105 | 5/1971 | Jones, Jr. | 333/254 X |
| 3,732,508 | 5/1973 | Ito et al. | 333/21 R |
| 4,291,278 | 9/1981 | Quine | 333/26 X |
| 4,455,537 | 6/1984 | La Prade et al. | 333/246 X |
| 4,458,222 | 7/1984 | Herstein et al. | 333/247 X |
| 4,538,124 | 8/1985 | Morrison | 333/246 |
| 4,550,296 | 10/1985 | Ehrlinger et al. | 333/246 X |
| 4,636,753 | 1/1987 | Geller et al. | 333/26 |

FOREIGN PATENT DOCUMENTS

| | | | |
|---|---|---|---|
| 3330099 | 3/1985 | Fed. Rep. of Germany | 333/247 |

OTHER PUBLICATIONS

Krumm, *A 30–Ghz GaAs FET Amplifier,* 1978 IEEE MTT-S International Microwave Symposium, 27–29 Jun. 1978, pp. 383–385.

*Primary Examiner*—Paul Gensler

*Attorney, Agent, or Firm*—Noel F. Heal; Robert J. Stern

[57] ABSTRACT

A structure for extra-high-frequency circuit modules, to take advantage of the low losses and convenience of assembly of waveguides, and at the same time to take advantage of the ease of tuning of microstrip lines. Each module is adapted to be conveniently connectable to others in a cascade arrangement, and each presents a waveguide interface to adjacent modules. If a module is to contain an active device, such as an amplifier, the module incorporates a microstrip section and two transition sections to couple the microstrip section to the waveguides at input and output. The microstrip section is easily tunable and is easier to couple to the active device.

4 Claims, 4 Drawing Figures

EXTRA HIGH FREQUENCY (EHF) CIRCUIT MODULE

This application is a continuation of application Ser. No. 737,630, filed 5-24-85, now abandoned.

BACKGROUND OF THE INVENTION

This invention relates generally to extrahigh-frequency (EHF) circuitry, operating at frequencies above 30 GHz (gigahertz) and, more specifically, to techniques for interfacing multiple circuit modules at those frequencies. Receivers operating in the EHF region typically employ antennas, arrays, or feed assemblies fabricated in the form of metal waveguides to provide for minimum loss and optimum performance. Metal waveguides are hollow tubes of rectangular or other cross section, through which electromagnetic energy is propagated. Propagation through waveguides is ensured by successive reflections on the conductive boundaries of the guides. Waveguides have relatively low losses, which is the principal reason they are preferred, since any losses directly degrade the overall performance of the receiver.

When long waveguide runs are required, such as from an antenna to the receiver, or if superior performance is desired, low-noise amplification is provided. Unfortunately, however, interfacing a waveguide with an active two-port amplifier device poses great difficulties. The principal one is that a waveguide has a transmission aperture that is orders of magnitude larger than the physical size of an amplifier device, such as a field-effect transistor. Moreover, input/output isolation is difficult to achieve, and provision must be made for electrical bias supplies to the amplifiers. When multiple amplifier stages are cascaded, the bias supplies have to be isolated from each other by series-connected decoupling capacitors, which increase losses in the system.

Another difficulty arises in the testing and assembly of interconnected EHF circuit modules. Typically, each module is tested separately before assembly, and test equipment for this purpose employs waveguide connections A test fixture inevitably introduces discontinuities between the fixture and the module being tested, and part of the testing procedure involves tuning the module to achieved a desired performance. Waveguides are relatively inconvenient to tune, since tuning involves adjustments of some kind to the physical waveguide structure. A more important problem is that, when the separately tested modules are subsequently assembled together as a system, the discontinuities that were present during testing are replaced by different discontinuities, and further tuning is usually required to obtain the desired performance.

It will be appreciated from the foregoing that there is a need for an EHF circuit module that eliminates or minimizes these problems. Ideally, the circuit module should employ an external waveguide interface, to provide low losses and ease of coupling with other modules and with test equipment, but should also provide for convenient coupling to active two-port devices, such as amplifiers. It is also very important that the circuit module be easily tunable when assembled in its final configuration. As will now be summarized, the present invention is directed to these ends.

SUMMARY OF THE INVENTION

The present invention resides in a radiofrequency (rf) circuit module having a waveguide interface for coupling to other modules, and employing an internal microstrip transmission line, for ease of coupling to active devices, and for ease of tuning. Briefly, and in general terms, the circuit of the invention comprises a waveguide input section, a waveguide output section, coupling means at the input and output sections, to facilitate coupling with modules having similar coupling means, a microstrip line section within the module, input transistion means for coupling energy from the waveguide input section to the microstrip line, output transistion means for coupling energy from the microstrip line to the waveguide output means, and an active device coupled to the microstrip line. The microstrip line facilitates both coupling to the active device and tuning of the module, and the waveguide sections provide for low losses and convenience of coupling to other modules.

In the illustrative embodiment of the invention, the transition means is a tapered or "fin-line" transition section formed on a common substrate with the microstrip section, and the microstrip line is formed on two substrates. One substrate supports the input transition and a section of microstrip line, and the other substrate supports the output transition and another section of microstrip line. The active device is located at the junction between the two substrates.

One useful embodiment of the module includes dual balanced amplifiers. The module in this case has two waveguide input sections and two waveguide output sections. There are also two input transition sections, two output transition sections, two microstrip line sections and two active amplifiers mounted on the microstrop lines. This module is used in conjunction with two quadrature hybrid couplers. These are conventional waveguide elements to convert a single-ended input signal to two balanced output signals differing in phase by ninety degrees, or to convert two balanced input signals separated by ninety degrees to a single-ended output signal. Although conventional from a waveguide design standpoint, the couplers both include coupling means identical with that on the amplifier module, to facilitate connection of the couplers to an amplifier module or to other types of modules. It will be understood, however, that the invention is not limited to amplifier modules. In a complete receiver system, amplifier modules, local oscillator modules, coupler modules, and other types of modules, may be interconnected to form the receiver system.

The principal advantages of the modular approach of the invention are, first, that the low losses and coupling convenience of a rectangular waveguide system are retained, but the advantages of microstrip lines are also included, namely ease of coupling to active devices and ease of tuning. The circuit module of the invention provides a high level of repeatability in manufacturing and assembly. Once the microstrip sections have been tuned, by selective addition to or removal of topographical features of the substrates, the resulting topography can be easily and permanently incorporated into the manufacturing process. Other advantages are a relatively low manufacturing cost, and minimization of the discontinuities between interconnected modules. yet another advantage is that decoupling capacitors between the modules are eliminated.

Other aspects and advantages of the invention will become apparent from the following more detailed description of the invention, taken in conjunction with the accompanying drawings.

DESCRIPTION OF THE PREFERRED EMBODIMENTS

Figure 1:
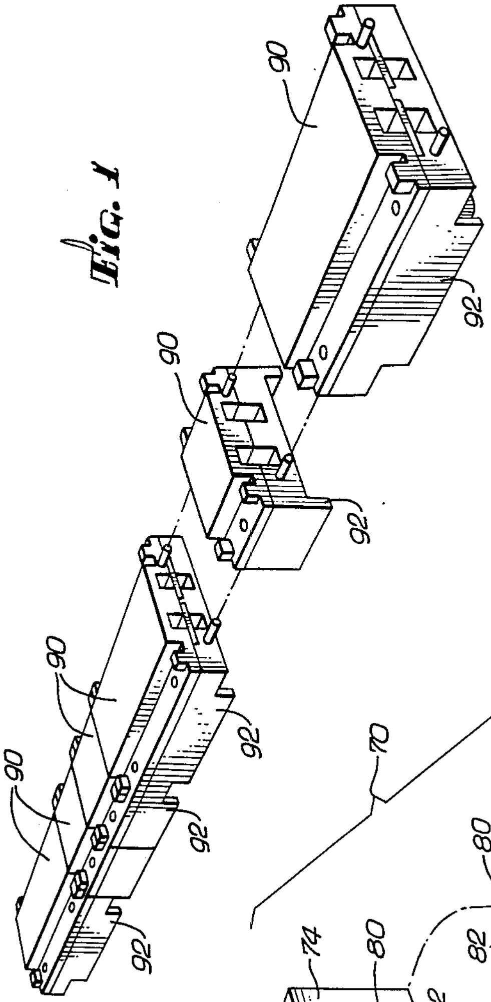
FIG. 1 is an exploded perspective view of a number of connected circuit modules of the invention.

As shown in the drawings for purposes of illustration, the present invention is concerned with extra-high-frequency (EHF) circuit modules and their interconnection. In the past, it has been a difficult and relatively costly process to provide for the interconnection of EHF circuit modules, such as amplifiers, couplers, and local oscillators, principally because of the difficulty of coupling waveguide structures to two-port active devices, such as amplifiers, and also because of the difficulty of tuning waveguides after testing and assembly. In spite of these drawbacks, the waveguide structures are desirable because of their low losses and ease of interconnection with each other and with test equipment.

Figure 3:
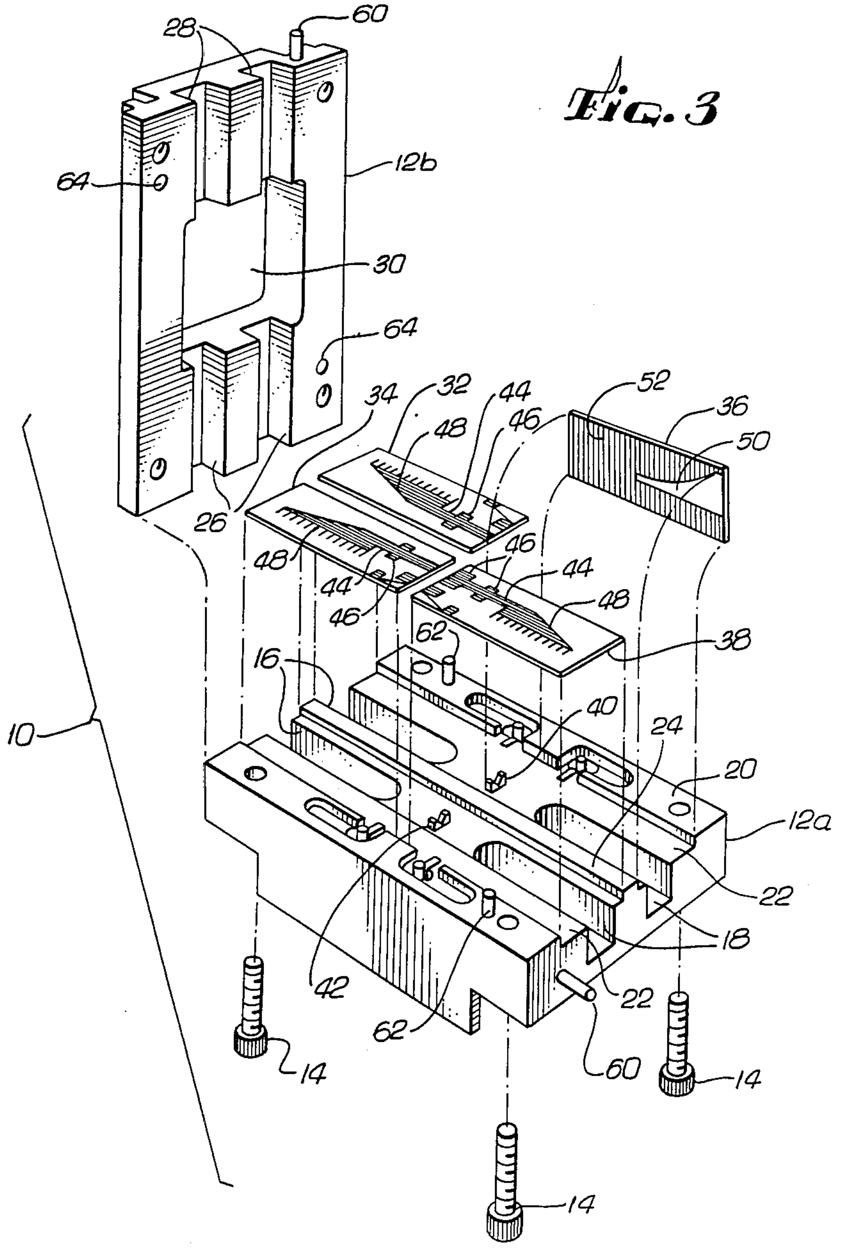
FIG. 3 is an exploded perspective view of a balanced amplifier module in accordance with the present invention.

In accordance with the invention, a radiofrequency (rf) circuit module is constructed to include waveguide sections for input and output, and also to include microstrip sections for coupling with active devices and for ease of tuning. FIG. 3 shows by way of example a balanced amplifier module, indicated generally by reference numeral 10, for use in the extra-high-frequency range. The module 10 includes a housing of two separable portions 12*a* and 12*b* held in an assembled position by set screws 14.

The bottom housing section 12*a* is basically a block of metal in which are formed two input channels 16 of rectangular cross section, each extending from one end face of the block to a rounded closed end, and two similarly shaped output channels 18, each extending from the opposite end face, aligned with a corresponding one of the input channels, and also terminating in a rounded closed end. The lower portion 12*a* has an upper surface 20 that interfaces with the upper portion 12*b*. The upper surface 20 has two parallel recesses 22 extending the full length of the portion 12*a* and having a width greater than the channels 16 and 18. Thus the recesses 22 leave a central raised rail 24 extending between the channels 16 and between the channels 18, and also leave raised areas of the surface 20 at each edge of the block parallel to the channels 16 and 18.

The upper half 12*b* of the housing has two parallel input channels 26 at one end and two parallel output channels 28 at its other end. The upper half 12*b* also has an opening 30 in a central position. As will be discussed, the opening 30 facilitates tuning of the device. When the halves of the housing 12 are assembled, the channels 16 and 26 together define a pair of input waveguides, and the channels 18 and 28 together define a pair of output waveguides.

The recesses 22 are designed to receive four rectangular substrates 32, 34, 36 and 38. Substrates 32 and 34 disposed in the input waveguides and substrates 36 and 38 are disposed in the output waveguides. The substrates 32 and 36 are aligned in the same recess and are separated by an integral spacer 40 in the center of the recess. Similarly, the substrates 34 and 38 are aligned in the other recess 22 and are separated by another spacer 42. Each of the substrates has a section of microstrip line 44 located at the end of the substrate furthest from the ends of the housing 12 from which the channels extend, that is to say nearest the center of the recesses 22. The microstrip line 44 includes a matching network 46.

Coupling from the microstrip sections to the waveguide sections is effected by a fin-line transition section 48 extending from the microstrip line out toward the outer end of the substrate. Basically, the fin-line section 48 includes a tapered portion of conductive material on top of the substrate, operating in conjunction with a tapered opening 50 in a ground plane 52 on the underside of each substrate, as shown for the substrate 36. At the outer edge of the substrate, energy is transmitted through the device in the manner of a waveguide, since there is no ground plane at that point, and the fin-line has tapered to zero width. As one progresses toward the center of the device, the fin-line increases in width, and so does the ground plane, thereby gradually effecting a transition from waveguided to microstrip transmission. The transition operates equally well in both directions, and is similar in principle to one described in a paper by J. H. C. VanHewven, entitled "A New Integrated Waveguide-Microstrip Transition," IEEE Trans., 1976, MTT-24, pp. 144–47.

Figure 4:
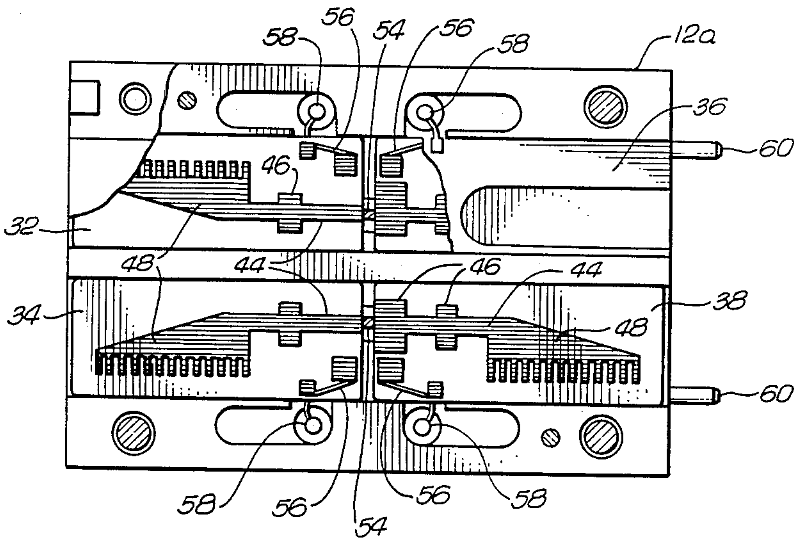
FIG. 4 is an enlarged plan view, with portions broken away, of the microstrip line and transition portions of the balanced amplifier of FIG. 3.

An amplifier, indicated diagrammatically at 54 in FIG. 4, is located on the lower half 12*a* of the housing, between each pair of substrates. In the illustrative embodiment of the invention, the amplifier 54 is a field-effect transistor (FET) designed for operation at extra high frequencies, such as a gallium arsenide (GaAs) FET. The source terminal of the FET is bonded to the housing, and the gate and drain terminals are connected to the microstrip lines on either side of transistor. Direct-current biasing of the transistor 54 is provided by a dc bias circuit 56 extending in from the side of the substrate. A bias voltage is applied through an rf choke and through pins 58 extending through to a channel (not shown) in the lower housing 12*a*, to facilitate connection with a power supply.

The module 10 includes two precision dowel pins 60 at one end of the housing 12 and two similarly positioned holes (not shown) at the opposite end. These allow precise location and alignment of modules to be coupled together. Dowel pins 62 and holes 64 are also used to locate the upper and lower halves of the housing 12 for assembly.

The module 10 provides a convenient waveguide interface with other modules, but includes a microstrip section to simplify interface with the amplifiers 54, and to facilitate tuning of the module. Tuning of microstrip lines is a relatively conventional process, in which metal, usually in the form of gold ribbon, is bonded to discrete spots of metalization formed on the upper surface of the substrate. Once a matching network has been empirically formed in this manner, the topology of the matching network, which is indicated by reference numeral 46, can be permanently incorporated into the manufacturing process, so that a tuned network will be repeatably formed by photolithographic means. The initial tuning process is facilitated in the illustrative embodiment by the presence of the opening 30 in the upper portion 12*b* of the housing.

Figure 2:
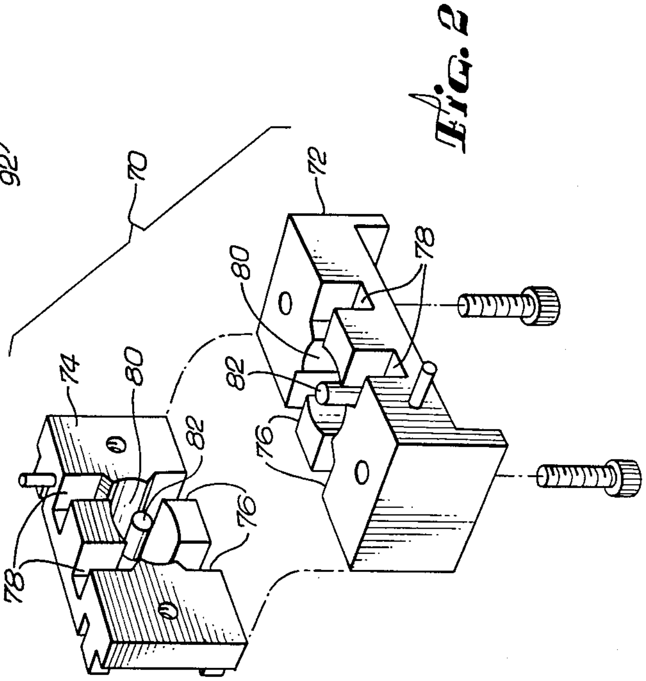
FIG. 2 is an exploded perspective veiw of a quadrature hybrid coupler configured in accordance with the invention.

FIG. 2 shows a quadrature hybrid coupler 70 for use in conjunction with the amplifier of FIGS. 3 and 4. The coupler 70 is formed to include a lower block 72 and an upper block 74, having the same width as the housing 12 of the amplifier module 10. Each block has two rectangular openings 76 in one face and two similar openings 78 in the opposite face. The channels do not extend the full length of the blocks, but instead intersect with a central mixing chamber 80 in which there is positioned a central post 82. The waveguide principles of the hybrid coupler are conventional and not critical to the invention. Suffice to say that, when a single-ended input signal is applied to one input channel of the coupler, two balanced output signals are obtained from the opposite end of the coupler, the two output signals being separated by a ninety degree phase angle. In a typical application, a single-ended signal is passed through a hybrid coupler, and then the balanced signals are amplified in an amplifier module, such as the module 10. If a single-ended output signal is required, the outputs from the amplifier module are passed through another coupler, used in a reverse sense to convert a balanced double-ended amplifier output into a single-ended signal again.

FIG. 1 shows how six separate modules 90 can be coupled together in sequence to form a receiver or other type of EHF system. Each module 90 includes an integral outer skirt 92, depending from each side of the housing of the module. When the interconnected modules 90 are placed in an enclosure (not shown), the skirts 92 form sidewalls of a channel, which may be used to supply dc bias signals to the amplifiers, or for other purposes.

It will be appreciated from the foregoing that the present invention represents a significant advance in the field of circuit modules for use at extra high frequencies. In particular, the invention provides a modular technique for constructing EHF circuitry, taking advantage of the convenience and low losses of waveguide structures, but also taking advntage of the tunability of internal microstrip sections and the greater ease with which microstrip can be coupled to two-port active devices. The resulting structure is low in cost and can be reliably fabricated in a repeatable manner. Finally, the elimination of decoupling capacitors effects a further reduction in cost over conventional construction techniques. It will also be appreciated that, although specific embodiments of the invention have been described in detail for purposes of illustration, various modifications may be made without departing from the spirit and scope of the invention. Accordingly, the invention is not to be limited except as by the appended claims.

We claim:

1. An extra-high-frequency (EHF) balanced circuit module, comprising:
   - two metallic blocks secured together and having channels formed in them to define a pair of waveguide input sections and a pair of waveguide output sections, and having coupling means at the input and output sections, to facilitate coupling with modules with similar coupling means;
   - two microstrip sections located within the modiule, each microstrip section being formed on first and second substrates aligned in substantially the same plane, and each substrate having a ground plane on one face and a metallized strip on the other face;
   - input transition means for coupling energy from the waveguide input sections to the microstrip sections;
   - output transition means for coupling energy from the microstrip sections to the waveguide output sections; and
   - two electrical devices coupled one to each of the microstrip sections, the electrical devices being positioned between the first and second substrates of the microstrip sections;
   - wherein the input transition means includes a fin-line section formed on the first substrate of each microstrip section, and the output transition means includes a fin-line section formed on the second substrate of each microstrip section, whereby the balnced circuit module is conveniently connectable to other circuit modules having identical coupling means.

2. An EHF balanced circuit module as defined in claim 1, wherein:
   - the coupling means includes at least one dowel pin on the end of the module, to engage a corresponding hole on the opposite end of another module.

3. An EHF balanced circuit module as defined in claim 1, wherein:
   - each fin-line section includes a tapered area of metallization extending from a relatively wide portion adjoining its associated microstrip section to a zero width near the edge of the substrate, and a tapered gap in the ground plane, extending from a full-width gap near the edge of the substrate to a zero-width gap adjoining the microstrip section.

4. An extra-high-frequency (EHF) balanced amplifier circuit, comprising:
   - an amplifier module including
     - two metallic blocks secured together and having channels formed in them to define a pair of waveguide input sections and a pair of waveguide output sections, and having coupling means at the input and output sections, to facilitate coupling with modules with similar coupling means,
     - two microstrip sections located within the module, each microstrip section being formed on first and second substrates aligned in substantially the same plane, nd each substrate having a ground plane on one face and a metallized strip on the other face,
     - input transition means for coupling energy from the waveguide input sections to the microstrip sections,
     - output transition means for coupling energy from the microstrip sections to the waveguide output sections, and
     - two amplifier devices coupled one to each of the microstrip sections, the amplifier devices being positioned between the first and second substrates of the microstrip sections,
     - wherein the input transition means includes a fin-line section formed on the first substrate of each microstrip section, and the output transition means includes a fin-line section formed on the second substrate of each microstrip section; and
   - a quadrature hybrid coupler module having coupling identical to the coupling means on the amplifier module, coupled to the amplifier module to provide balanced quadrature signals for input to the amplifier module, from a single-ended input signal applied to the quadrature hybrid coupler module.

* * * * *